(12) United States Patent
Takai

(10) Patent No.: US 10,316,424 B2
(45) Date of Patent: Jun. 11, 2019

(54) FLEXIBLE ELECTRICALLY CONDUCTIVE STRUCTURE, FLEXIBLE WIRING BOARD, PRODUCTION METHOD THEREOF, AND ELECTRONIC DEVICE INCLUDNG THE SAME

(71) Applicant: SAMSUNG ELECTRONICS CO., LTD., Suwon-si, Gyeonggi-do (KR)

(72) Inventor: Kenji Takai, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/438,931

(22) Filed: Feb. 22, 2017

(65) Prior Publication Data

US 2017/0241039 A1    Aug. 24, 2017

(30) Foreign Application Priority Data

Feb. 23, 2016 (KR) .................. 10-2016-0021352

(51) Int. Cl.

| | |
|---|---|
| *C25D 15/00* | (2006.01) |
| *C25D 1/00* | (2006.01) |
| *C25D 3/46* | (2006.01) |
| *C25D 5/02* | (2006.01) |
| *C25D 5/48* | (2006.01) |

(Continued)

(52) U.S. Cl.
CPC ............. *C25D 15/00* (2013.01); *C25D 1/00* (2013.01); *C25D 3/46* (2013.01); *C25D 5/022* (2013.01); *C25D 5/48* (2013.01); *H05K 1/028* (2013.01); *H05K 1/0353* (2013.01); *H05K 1/09* (2013.01)

(58) Field of Classification Search
CPC ...... H05K 1/028; H05K 1/118; H05K 1/0353; H05K 1/09; H05K 2201/026; H05K 2201/05; H05K 2201/0323; H05K 2201/032; H05K 1/092; H05K 1/097
See application file for complete search history.

(56) References Cited

U.S. PATENT DOCUMENTS

| | | |
|---|---|---|
| 6,484,505 B1 | 11/2002 | Brown et al. |
| 8,021,747 B2 | 9/2011 | Yi et al. |

(Continued)

FOREIGN PATENT DOCUMENTS

| | | |
|---|---|---|
| JP | 2006152372 A | 6/2006 |
| JP | 2006156111 A | 6/2006 |

(Continued)

OTHER PUBLICATIONS

Arai et al., "Effects of Additives on CU-MWCNT Composite Plating Films", Journal of The Electrochemical Society, 157(3), 2010, D127-D134.

(Continued)

*Primary Examiner* — Roshn K Varghese
(74) *Attorney, Agent, or Firm* — Harness, Dickey & Pierce, P.L.C.

(57) ABSTRACT

A flexible electrically conductive structure includes: a first polymer layer; and an electrically conductive layer disposed on a surface of the first polymer layer, wherein the electrically conductive layer includes an electrically conductive metal and a nanocarbon material, and wherein the flexible wiring board is to be used with a bending portion provided at least one position of the electrically conductive layer.

24 Claims, 12 Drawing Sheets

(51) Int. Cl.
*H05K 1/02* (2006.01)
*H05K 1/03* (2006.01)
*H05K 1/09* (2006.01)

(56) References Cited

U.S. PATENT DOCUMENTS

| | | | |
|---|---|---|---|
| 8,840,954 B2 | 9/2014 | Yi et al. | |
| 9,476,138 B2 | 10/2016 | Suwa et al. | |
| 9,513,070 B2 | 12/2016 | Suwa et al. | |
| 2003/0089519 A1* | 5/2003 | Okada | H05K 1/0271 174/254 |
| 2005/0116336 A1* | 6/2005 | Chopra | B82Y 10/00 257/720 |
| 2006/0057742 A1* | 3/2006 | Mano | B82Y 10/00 438/1 |
| 2006/0099438 A1 | 5/2006 | Arai et al. | |
| 2008/0086876 A1* | 4/2008 | Douglas | B82Y 10/00 174/262 |
| 2008/0123475 A1 | 5/2008 | Fujimori et al. | |
| 2008/0257586 A1* | 10/2008 | Chen | H01L 23/49816 174/254 |
| 2010/0051320 A1* | 3/2010 | Hong | B82Y 10/00 174/250 |
| 2011/0216020 A1 | 9/2011 | Lee et al. | |
| 2013/0087370 A1* | 4/2013 | Inaba | H05K 3/244 174/254 |
| 2014/0094072 A1 | 4/2014 | Seki et al. | |
| 2015/0070309 A1 | 3/2015 | Kang | |
| 2016/0040023 A1 | 2/2016 | Ishii et al. | |
| 2016/0208104 A1 | 7/2016 | Mizuno et al. | |
| 2016/0345434 A1* | 11/2016 | Jin | C03C 17/09 |

FOREIGN PATENT DOCUMENTS

| | | |
|---|---|---|
| JP | 2006265667 A | 10/2006 |
| JP | 2007009333 A | 1/2007 |
| JP | 2007179871 A | 7/2007 |
| JP | 2008056950 A | 3/2008 |
| JP | 2008149393 A | 7/2008 |
| JP | 2008157912 A | 7/2008 |
| JP | 2008157913 A | 7/2008 |
| JP | 2008177165 A | 7/2008 |
| JP | 2010027916 A | 2/2010 |
| JP | 2010192669 A | 9/2010 |
| JP | 2010202918 A | 9/2010 |
| JP | 2010215977 A | 9/2010 |
| JP | 2010215978 A | 9/2010 |
| JP | 2010222707 A | 10/2010 |
| JP | 2011058061 A | 3/2011 |
| JP | 2011094177 A | 5/2011 |
| JP | 2011181062 A | 9/2011 |
| JP | 2012049107 A | 3/2012 |
| JP | 2012172245 A | 9/2012 |
| JP | 2012225685 A | 11/2012 |
| JP | 2013011016 A | 1/2013 |
| JP | 2013082984 A | 5/2013 |
| JP | 2013104111 A | 5/2013 |
| JP | 2013105980 A | 5/2013 |
| JP | 2013185185 A | 9/2013 |
| JP | 2014063714 A | 4/2014 |
| JP | 2014095117 A | 5/2014 |
| JP | 2014150118 A | 8/2014 |
| JP | 2014207087 A | 10/2014 |
| JP | 2015034279 A | 2/2015 |
| JP | 2015042717 A | 3/2015 |
| JP | 2015042776 A | 3/2015 |
| JP | 2015043309 A | 3/2015 |
| JP | 2015053055 A | 3/2015 |

OTHER PUBLICATIONS

Fujishige et al., "Electric Contact Characteristic under Low Load of Silver-Carbon Nanotube Composite Plating Film Corroded Using H2S Gas", Applied Physics Express, 3, 2010, 065801-1-065801-3.

M. Reibold et al., "Carbon nanotubes in an ancient Damascus sabre", Nature vol. 444, 2006, pp. 286.

Shibuya et al., "Large-scale Simulation on Nanocarbon Materials for Reducing Environmental Loads", JAMSTEC, Retrieved from online Mar. 10, 2017 https://www.jamstec.go.jp/es/jp/project/sangyou.../H25_ZEON_en.pdf.

Subramaniam et al., "One hundred fold increase in current carrying capacity in a caron nanotube-copper composite", Nature Communications, Jul. 23, 2013, pp. 1-7.

Watanabe et al., "An 8.67-in. Foldable OLED Display with an In-cell Touch Sensor", SID, 2015, pp. 246-249.

* cited by examiner

FLEXIBLE ELECTRICALLY CONDUCTIVE STRUCTURE, FLEXIBLE WIRING BOARD, PRODUCTION METHOD THEREOF, AND ELECTRONIC DEVICE INCLUDNG THE SAME

CROSS-REFERENCE TO RELATED APPLICATION

This application claims priority to and the benefit of Korean Patent Application No. 10-2016-0021352, filed in the Korean Intellectual Property Office on Feb. 23, 2016, and all the benefits accruing therefrom under 35 U.S.C. § 119, the entire content of which is incorporated herein by reference.

BACKGROUND

1. Field

An electrically conductive structure, a flexible wiring board, a production method thereof, and an electronic device including the same are disclosed.

2. Description of the Related Art

A flexible electrically conductive structure, such as a flexible wiring board or a flexible transparent electrode, has been employed in the various electronic devices. To provide for downsizing, improving function, and wearability, the flexible wiring board would desirably provide high conductivity and tolerate bending and flexural deformation, for example maintaining original electrical properties (e.g., low electrical resistance) even when the wiring board or the electrically conductive structure is repeatedly subjected to folding or bending with a small curvature radius.

There have been attempts to provide a flexible wiring board or a flexible electrically conductive structure by using a metal wire such as copper, a metal nanowire, a metal oxide, or graphene, but providing suitable electrical properties and bendability at the same time has been difficult for most of the products developed so far. Accordingly, there remains a need for a flexible conductive structure, e.g., a flexible wiring board capable, having improved bending properties together with the desirable electrical properties.

SUMMARY

An embodiment provides a flexible wiring board having improved bending properties as well as desirable electrical properties.

Another embodiment provides a production method of the flexible wiring board.

Yet another embodiment provides an electronic device including the flexible wiring board.

Still another embodiment provides a flexible conductive structure.

In an embodiment, a flexible electrically conductive structure includes
a first polymer layer; and
an electrically conductive layer disposed on a surface of the first polymer layer,
wherein the electrically conductive layer includes an electrically conductive metal and a nanocarbon material, and
wherein the flexible wiring board is to be used with a bending portion provided at least one position of the electrically conductive layer.

In the electrically conductive metal, the nanocarbon material has a preferred orientation.

A second polymer layer may be disposed on the electrically conductive layer.

The first polymer layer and the second polymer layer may be electrically insulating.

The first polymer layer and the second polymer layer may include a polyester, a polyacryl, a polyolefin, cellulose, a polycarbonate, a polyimide, a polyamide, a polyphenylenesulfide, a polyetheretherketone, a liquid crystal polymer, an epoxy resin, or a combination thereof.

The electrically conductive metal may include silver (Ag), copper (Cu), nickel (Ni), gold (Au), aluminum (Al), tungsten (W), platinum (Pt), iron (Fe), or a combination thereof.

The electrically conductive metal may include silver, copper, or a combination thereof.

The electrically conductive layer may be a rolled product of a co-deposited composite of the electrically conductive metal and the nanocarbon material by electrodeposition.

The rolled product may be obtained by rolling the co-deposited composite to have a thickness of less than or equal to about 50% relative to its initial thickness.

The nanocarbon material may include carbon nanotube, fullerene, graphene, or a combination thereof.

At least a portion of the nanocarbon material may be oriented parallel to the surface of the first polymer layer.

The number of the nanocarbon material oriented parallel to the surface of the first polymer layer may be greater than the number of the nanocarbon material oriented perpendicularly.

A content of the nanocarbon material may be greater than or equal to about 0.01 wt %, based on the total weight of the electrically conductive layer.

A content of the nanocarbon material may be greater than or equal to about 0.05 wt % and less than or equal to about 1 wt %, based on the total weight of the electrically conductive layer.

A curvature radius of the bending portion may be less than or equal to 3 mm.

The electrically conductive structure may be used to provide a bending portion, and the bending portion may be formed by repetitive movement of sliding bending, folding bending, hinge bending, or a combination thereof.

A resistance change may be less than about 400% in a folding-bending test, where the wiring board is bent 40000 times at a bending radius of 1 mm.

A thickness of the electrically conductive layer may be about 0.2 micrometer ($\mu$m) to about 20 $\mu$m.

A thickness of the first polymer layer may be about 10 $\mu$m to about 150 $\mu$m.

Also disclosed is an electronic device including the flexible electrically conductive structure.

Another embodiment provides an electronic device including the flexible wiring board.

The electronic device may be a display, a touch panel screen, a wearable device, a battery, an elastic organic light emitting diode (OLED) display, an elastic human motion sensor, an elastic artificial muscle, an elastic actuator, or an elastic semiconductor.

In accordance with another embodiment, a method of manufacturing the aforementioned flexible wiring board includes, preparing a plating bath including a salt of an electrically conductive metal and a nanocarbon material;
disposing a metal plate and a counter electrode in the plating bath;
electrodepositing the electrically conductive metal and the nanocarbon material to provide a co-deposited composite on the metal plate, the co-deposited composite comprising a dispersion of the nanocarbon material in the electrically conductive metal;

rolling the composite to have a thickness of less than or equal to about 50% of its initial thickness; and disposing a polymer layer on a surface of the rolled composite.

The rolling may increase the number of the nanocarbon material oriented parallel to the surface of the first polymer layer.

In another embodiment, a flexible electrically conductive structure includes a substrate; and an electrically conductive layer on a surface of the substrate, wherein the electrically conductive layer includes an electrically conductive metal and a plurality of carbon nanotubes dispersed in the electrically conductive metal, and wherein the plurality of carbon nanotubes has a preferred orientation.

An additional polymer layer may be disposed on the electrically conductive layer.

The electrically conductive layer may include a rolled product of a co-deposited composite of the electrically conductive metal and the nanocarbon material provided by electrodeposition.

In the flexible conductive structure, the number of the nanocarbon material oriented parallel to the surface of the first polymer layer may be greater than the number of the nanocarbon material oriented perpendicularly.

The electrically conductive layer may be patterned to have an open space.

In the electrically conductive layer, a ratio of the open space may be greater than or equal to about 50% relative to a total area of the electrically conductive layer.

In the electrically conductive layer, a ratio of the open space may be greater than or equal to about 80% relative to a total area of the electrically conductive layer.

For a use in a transparent electrode, the ratio of the open space in the electrically conductive layer may be greater than or equal to about 99% relative to the entire area of the electrically conductive layer.

The structure may have a resistance change of less than about 400% when evaluated using a folding-bending test where it is bent 40000 times with a bending radius of 1 mm.

The structure may be a flexible wiring board, a transparent electrode, or a lead wire. In some embodiments, the flexible wiring board or the flexible electrically conductive structure may show enhanced bending resistance even under a condition of a small radius of curvature or a condition of repetitive bending, and thus it may be used in many bending portions of various electronic device such as a display, a wearable device, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
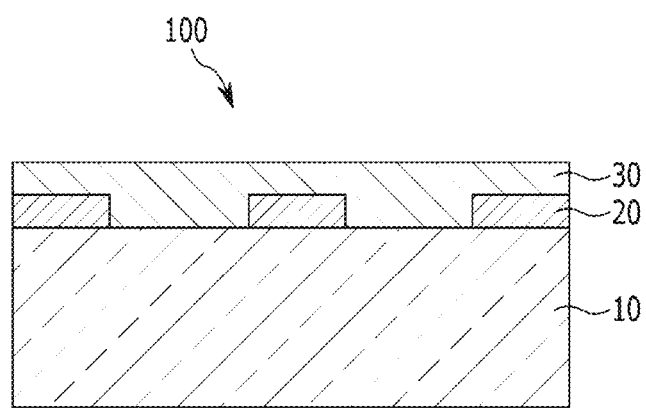
FIG. 1 is a schematic view of an embodiment of a flexible wiring board.

Advantages and characteristics of this disclosure, and a method for achieving the same, will become evident referring to the following embodiments together with the drawings attached hereto. However, the disclosed embodiments should not be construed as being limited to the embodiments set forth herein. Like reference numerals refer to like elements throughout.

If not defined otherwise, all terms (including technical and scientific terms) in the specification may be defined as commonly understood by one skilled in the art. The terms defined in a generally-used dictionary may not be interpreted ideally or exaggeratedly unless clearly defined.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising", will be understood to imply the inclusion of stated elements but not the exclusion of any other elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, the singular includes the plural unless mentioned otherwise.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Polyacryl" as used herein refers to any polymer derived from the any acrylic acid, methacrylic acid, ($C_{1-12}$ alkyl) acrylate, ($C_{1-12}$ alkyl) methacrylate, or a combination thereof.

In an embodiment, a flexible electrically conductive structure 100, e.g., a flexible wiring board, comprises
a first polymer layer 10; and
an electrically conductive layer 20 disposed on a surface of the first polymer layer.

A second polymer layer 30, for example, a coverlay film, may be disposed on the electrically conductive layer (see FIG. 1).

The flexible electrically conductive structure or the flexible wiring board may exhibit improved bending properties even when it is bended at a small radius curvature for example repeatedly (e.g. for a number of times). Therefore, it may be used for example by being disposed in a bending portion of different electronic devices (e.g., a display device, a wearable device). Without wishing to be bound by any theory, we believe that in the flexible electrically conductive structure or the flexible wiring board of the embodiments, the dispersed nanocarbon material (e.g., a plurality of CNTs) may suppress crack generation in the metal, improving the bending properties of the composite including the meal and the CNTs. In addition, when at least a portion of the CNTs are oriented parallel to a surface of the $1^{st}$ polymer layer, the CNT may hinder the propagation of the crack, thereby further improving the bending properties.

The first polymer layer and the second polymer layer may be electrically insulating. For example, the first polymer layer and the second polymer layer may each independently comprise a polyester such as a polyethylene terephthalate, polyethylene naphthalate, a polyacryl such as a polymethyl (meth)acrylate, a polyolefin such as polyethylene or polypropylene, a cellulose such as triacetylcellulose and the like, a polycarbonate, a polyimide, a polyamide, a polyphenylene sulfide, a polyetheretherketone, a liquid crystal polymer, an epoxy polymer, or a combination thereof, but are not limited thereto. The first polymer layer may comprise a polyimide. The first polymer layer may be optically transparent. The first polymer layer may include a low elastic polymer. The second polymer layer may comprise a polyimide. The second polymer layer may be optically transparent. The first polymer layer may include a polymer having a lower elasticity than the second polymer. The first polymer layer may have an elastic modulus of less than or equal to about 3 gigaPascals (GPa), a glass transition temperature (Tg) of greater than or equal to about 250° C., and elongation at break of greater than or equal to about 8%. Use of a polymer having an elastic modulus of about 0.1 GPa to about 3 GPa, about 0.2 GPa to about 2 GPa, or about 0.3 GPa to about 1 GPa; a Tg of about 250° C. to about 400° C., about 275° C. to about 375° C., or about 300° C. to about 350° C.; and an elongation at break of about 8% to about 100%, about 15% to about 90%, or about 20% to about 80%, is mentioned. These polymers may be synthesized by a known method or may be commercially available, and can be selected by one of skill in the art without undue experimentation.

Figure 2:
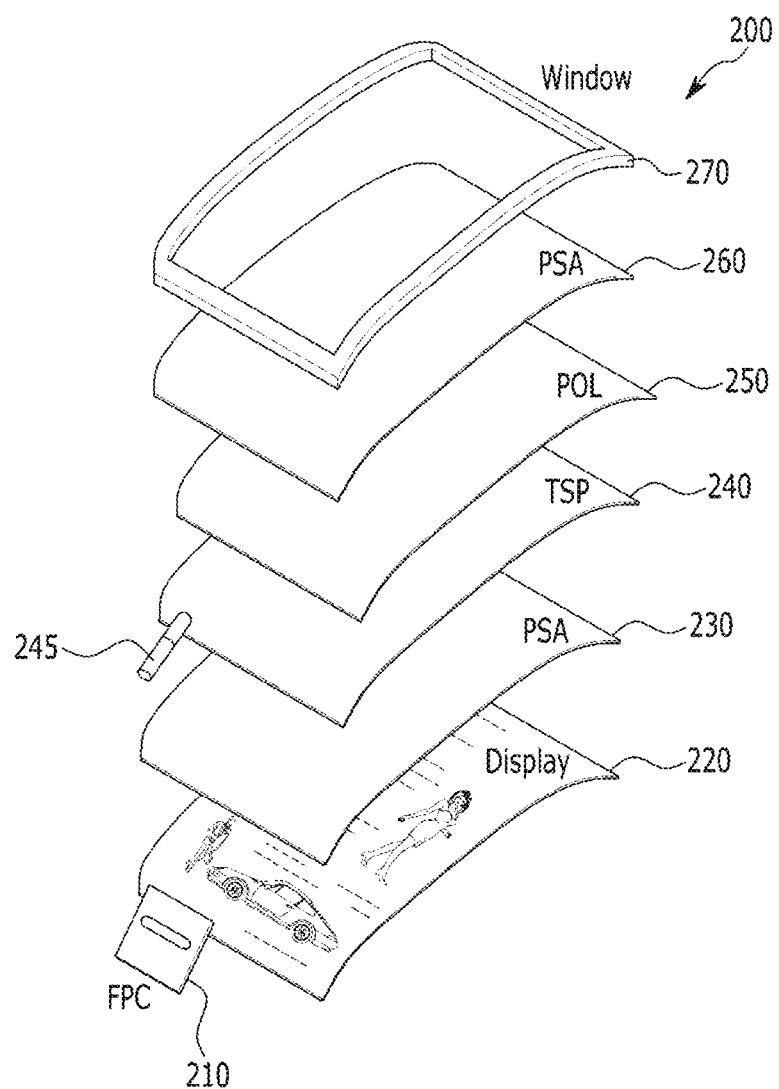
FIG. 2 is a schematic exploded view of an embodiment of an electronic device including a flexible wiring board or a flexible electrically conductive structure.

A thickness of the first polymer layer is not particularly limited and may be selected appropriately. For example, a thickness of the first polymer layer may be greater than or equal to about 10 micrometers (μm), but is not limited thereto, and maybe about 10 μm to about 300 μm, 15 μm to about 190 μm, or about 20 μm to about 180 μm. FIG. 2 shows an exploded view an embodiment of a display system 200 (e.g., an OLED). In some cases, the flexible printed circuit 210 (FPC) may be folded and bent to be disposed under the display 220. The display 220 may include a thin-film transistor (TFT) electrode and the electrically conductive structure (e.g., an electrode) may be used for the wiring of the TFT electrode. The electrically conductive structure according to an embodiment may be used for a touch sensor of a transparent electrode 240 (TSP) and may be used for a lead wire 245 (a terminal wire) of a transparent electrode. In some cases, the touch sensor or the FPC may be disposed outside a thick display, in which case a strain (ε) may be greater than or equal to about 0.03, that is, greater than or equal to about 3%. When the strain (ε) is greater than or equal to about 0.01, a Cu or Al wire has insufficient bending properties and thus the resistance of a Cu or Al conductor tends to increase upon bending. The electrically conductive structure, e.g., a flexible wiring board, may be more effective than a Cu or Al wire when the strain is greater than or equal to about 0.01; and the electrically conductive structure, e.g., the flexible wiring board, may be far more effective when the strain is greater than or equal to about 0.03. Also, the display 200 shown in FIG. 2 may have a total thickness of greater than about 200 μm. In this case, a wire located near to the bending center is rarely strained, but the regions about 100 μm apart from the bending center tend to have a strain of greater than or equal to about 0.03. The flexible wiring board or the electrically conductive structure of an embodiment may be disposed in a highly-strained position, which may increase a freedom of design of a device. Also shown in FIG. 2 is a first pressure sensitive adhesive layer 230, a polarizer 250, a second pressure sensitive adhesive layer 260, and a bezel 270.

An adhesive layer (not shown) may be interposed between the first polymer layer and the electrically conductive layer, but is not limited thereto. The first polymer layer may be formed with a single polymer or a mixture of a plurality of different polymers. The first polymer layer may comprise a single polymer film, or may be prepared by adhering two or more same or different polymer film(s) to each other under the conditions of, for example, heating and/or pressing.

The electrically conductive layer includes an electrically conductive metal and a nanocarbon material, e.g., a plurality of carbon nanotubes. The nanocarbon material may be dispersed in the matrix of the electrically conductive metal, for example, uniformly, to provide a composite.

The electrically conductive metal may comprise silver (Ag), copper (Cu), nickel (Ni), gold (Au), aluminum (Al), tungsten (W), platinum (Pt), iron (Fe), or a combination thereof. The electrically conductive metal may be selected considering the cost, the circuit forming property, the bending resistance, the corrosion resistance, and the like. According to an embodiment, the electrically conductive metal may include a primary component of silver (Ag) and/or copper, and may consist of silver (Ag) or copper. According to an embodiment, the silver (Ag)-included electrically conductive layer may also suppress ion migration.

The nanocarbon material may reduce the corrosion of a metal by forming a composition with a metal. For example, it may suppress the corrosion of a metal such as copper, silver, or aluminum, which is easily corroded, and suppress the increase of an elongation elastic modulus due to the corrosion; thus it may maintain the flexibility of a metal, so that the bending resistance may be improved. In addition, an increase in the sheet resistance may be prevented by suppressing the corrosion. Among the carbon nanomaterials, and while not wanting to be bound by theory, it is understood that carbon nanotube may maintain the conductivity even in the case that the metal is broken during the bending, so it is highly effective.

The nanocarbon material may comprise a plurality of carbon nanotubes, fullerene, graphene, or a combination thereof.

The carbon nanotube refers to a carbon allotrope having a nanostructure (e.g., cylindrical nanostructure) and may include a carbon nanoparticle, a carbon nanorope, a carbon nanoribbon, a carbon nanofibril, a carbon nanoneedle, a carbon nanorod, a carbon nanocone, and the like. The carbon nanotube may include a single-walled carbon nanotube (SWCNT), a double-walled carbon nanotube (DWCNT), a multi-walled carbon nanotube (MWCNT), or a combination thereof, but is not limited thereto. The single-walled CNT may further improve the conductivity of a wiring board. The double-walled CNT or the multi-walled CNT may reduce the cost of producing a wiring board.

The size of the nanocarbon material (e.g., carbon nanotube, fullerene, graphene) is not particularly limited, and may be appropriately selected. For example, a size of the nanocarbon material (e.g., a diameter of carbon nanotube or fullerene, or a thickness of graphene) may be less than or equal to about 200 nm, for example, less than or equal to about 50 nm, less than or equal to about 40 nm, less than or equal to about 30 nm, or less than or equal to about 20 nm. The diameter may be selected in view of the dispersibility of the nanocarbon material (carbon nanotube).

The length of the carbon nanotube (or a lateral directional size of the graphene) is not particularly limited, and may be appropriately selected. The length of carbon nanotube may be greater than or equal to about 100 nm, for example, greater than or equal to about 1 μm, greater than or equal to about 2 μm, or greater than or equal to about 3 μm, but is not limited thereto. The length of the carbon nanotube may be less than or equal to about 100 μm, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, or less than or equal to about 20 μm, but is not limited thereto. When the electrically conductive layer is in the form of a wire, it may use carbon nanotube having a length which is shorter than the width of the wire (e.g., a width of the electrically conductive layer). For example, when the wire has a width of about 3 μm, it may use nanocarbon material (e.g., carbon nanotube or graphene) having a size (e.g., length or side directional size) of less than about 3 μm, so as to reduce the risk of defective wire.

For example, the fullerene has an electron particle diameter of about 7.1 angstrom, its diameter increases as the number of carbon atoms increases to be 60, 70, 74, 76, 78, or the like. Any size of fullerene may be used. The graphene is a flat material and a small piece of 100 nm or lower may be used, but is not limited thereto. The CNT having a size of about 0.4 nm to 50 nm may be freely used because they are smaller than a typical wiring space.

The nanocarbon material may be synthesized by a known method or may be commercially available. For example, the carbon nanotube may be commercially available or may be synthesized by a known method (e.g., vapor deposition such as chemical vapor deposition, catalytic chemical vapor deposition, carbon catalyst vapor deposition or the like; high-pressure carbon monoxide process, arc discharge, laser application, plasma synthesis, or the like).

Fullerene and graphene may be obtained by a known manufacturing method or may be commercially available.

A content of the nanocarbon material (e.g., the carbon nanotube) may be greater than or equal to about 0.01 weight percent (wt %), for example, greater than or equal to about 0.05 wt %, greater than or equal to about 0.06 wt %, or greater than or equal to about 0.09 wt %, based on the total weight of the electrically conductive layer. A content of the nanocarbon material may be about 0.01 weight percent (wt %) to about 3 wt %, about 0.05 wt % to about 2.5 wt %, or about 0.06 wt % to about 2 wt %, based on the total weight of the electrically conductive layer. The upper content limit of carbon nanotube is not particularly defined, but an excessively high amount of the carbon nanotube may make the plating process difficult. For example, the upper limit of carbon nanotube amount may be about 3 wt %, based on the total weight of the electrically conductive layer, but is not limited thereto The electrically conductive layer may be obtained by providing a co-deposited composite of the electrically conductive metal and the nanocarbon material (e.g., carbon nanotube) by the electrodeposition (e.g., electroplating); and rolling (e.g., hot or cold rolling) the co-deposited composite. A method of manufacturing a co-deposited composite and the method of rolling the same will be described in further detail in conjunction with disclosure of a method of manufacturing a flexible wiring board.

In the co-deposited composite, the nanocarbon material (e.g., a plurality of carbon nanotubes) may be uniformly dispersed in an electrically conductive metal matrix, and the rolling process may cause the nanocarbon to have a preferred orientation, e.g., a fraction of the nanocarbon oriented in a selected direction, e.g., a first direction, is greater than a fraction of the nanocarbon oriented in a non-selected direction, e.g., a second direction. For example, at least a portion of the nanocarbon material may be oriented parallel to a surface of the first polymer layer. Thus when the nanocarbon has a preferred orientation, the nanocarbon does not have a random orientation. In an embodiment, the number of the carbon nanotubes oriented parallel to the surface of the first polymer layer may be greater than the number of carbon nanotubes oriented in another orientation, e.g., oriented perpendicular to the surface. The orientation of the CNTs may be confirmed by a scanning electron microscopy or a transmission electron microscopy. As used herein, the term "the CNT being parallel to the first polymer layer or the substrate" refers to the case where a straight line extending in a longitudinal direction of the CNT does not meet the surface of the first polymer layer or the substrate or the case where there is an acute angle formed between a straight line extending in a longitudinal direction of the CNT and the first polymer layer (or the substrate). The acute angle may be less than or equal to about 75 degree, less than or equal to about 70 degree, less than or equal to about 65 degree, less than or equal to about 60 degree, less than or equal to about 55 degree, less than or equal to about 50 degree, or less than or equal to about 45 degree, Without wishing to be bound by any theory, it is believed that at least a portion of the carbon nanotubes is oriented in a selected direction by the rolling process, and the improved orientation provides improved bending properties of the electrical conductor, e.g., wiring board, without substantially changing the electrical properties of the conductive structure.

The rolled product may be obtained by rolling the co-deposited composite to have a thickness of less than or equal to about 50%, for example, less than or equal to about 45%, less than or equal to about 40%, less than or equal to about 35%, less than or equal to about 30%, or less than or equal to about 25% relative to its initial thickness, e.g., rolling the co-deposited composite to have a thickness of about 1% to about 50%, or about 5% to about 45%, or about 10% to about 40%, based on an initial thickness, i.e. a thickness before rolling. The rolling ratio may be affected by the malleability and the ductility of the metal. For example, the rolling may be conducted as long as no pinhole occurs in the rolled product. The ratio of the thickness may be appropriately selected considering the production cost, or the dispersibility of nanocarbon material (e.g., carbon nanotube), and the like. Such a thickness ratio may be desired in light of the dispersability or the latitudinal orientation of the nanocarbon material (e.g., carbon nanotubes).

The thickness of the electrically conductive layer may substantially vary with a region where the wiring board (or a conductor structure) to be used. For example, when used to provide a flexible pinboard, the electrically conductive layer may have a thickness ranging from about 2 μm to about 30 μm, or from about 4 μm to about 10 μm. In case of the flexible pinboard, an increased thickness of the conductor may be desired in order to prevent electric signal attenuation.

The electrically conductive structure for use in an electrode or in a lead wire for a touch panel may have a thickness which is thinner than that provided for a flexible pin board. The thickness of the electrically conductive layer may range from about 0.1 μm to about 2 μm, or from about 0.2 μm to about 1 μm.

As described in further detail below, a thinner electrically conductive layer may result in improved bending properties. According to an embodiment, the electrically conductive structure, e.g., the flexible wiring board, may provide the improved bending properties even when a relatively thick electrically conductive layer is used.

When the electrically conductive structure is employed in an electronic device, it can be designed such that at least a portion of the electrically conductive layer has a bending portion. For example, when the electrically conductive structure is included in an electronic device, such as a flexible display, a folding smart phone, E-paper, and the like, it may be folded, twisted, or deformed, and thus the bending portion may be provided at a selected location of the electrically conductive layer.

For example, a curvature radius of the bending portion may be less than or equal to about 3 mm, less than or equal to about 2 mm, or less than or equal to about 1 mm, e.g., about 0.01 mm to about 3 mm, about 0.02 mm to about 2 mm, or about 0.05 mm to about 1 mm. The bending may comprise sliding bending, folding bending, hinge bending, or a combination thereof, and may comprise a repetitive operation (i.e., the structure may be bent for many times). The wiring board may have a resistance change of less than about 400% as determined by a folding-bending test where it is bent 40000 times with a bending radius of 1 mm according to the Equation 1:

$$[(R-R_0)/R_0]\times 100\% \tag{1}$$

Herein, $R_0$ is an initial resistance and R is resistance after 40000 times bending.

For example, the resistance change may be less than about 100%, less than about 40%, or less than about 10%, or about 1% to about 100%, about 2% to about 80%, or about 4% to about 60%. A level of the difficulty of the bending test at a radius of 1 mm is significantly different depending upon the strain (ε) on the metal. The strain on the metal is determined by a distance from the bending center line (Neutral Plane) of the bending portion. In the folding bending test shown in FIG. 8, a distance X (m) from the bending center line (Neutral Plane) may be quantified as in Equation 2:

$$X=[t_{PI}^2 E_{PI}+\{(t_{PI}+t_{Me})^2-t_{PI}^2\}E_{Me}+\{(t_{PI}+t_{Me}+t_{CL})^2-(t_{PI}+t_{Me})^2\}E_{CL}]/\{2(t_{PI}E_{PI}+t_{Me}E_{Me}+t_{CL}E_{CL})\} \quad (2),$$

wherein
$t_{CL}$ is a thickness (m) of cover layer;
$t_{Me}$ is a thickness (m) of a metal layer;
$t_{PI}$ is a thickness (m) of a support layer (e.g., polyimide);
$E_{CL}$ is an elongation elastic modulus (Pa) of a cover layer;
$E_{Me}$ is an elongation elastic modulus (Pa) of a metal layer; and
$E_{PI}$ is an elongation elastic modulus (Pa) of a support layer (generally polyimide);
and the strain (£) in this case may be quantified using Equation 3:

$$\varepsilon=X/(0.001-tCL-tMe-X) \quad (3)$$

Generally, when the strain is less than or equal to about 0.01, that is, when the metal is elongated by about 1% or more, bending of about 40,000 times at a bending radius of about 1 mm may be easily conducted. However, when the strain is greater than or equal to about 0.03 (i.e., when the metal is elongated by about 3% or more), bending of about 40,000 times at a bending radius of about 1 mm may become very difficult. However, the electrically conductive structure, such as the flexible wiring board according to an embodiment may be bent at a bending radius of about 1 mm even with a relatively high strain of greater than or equal to about 0.03 without a significant change to its desirable electrical properties.

Another embodiment provides an electronic device including the flexible electrically conductive structure such as the flexible wiring board, which will be described in further detail below. The electronic device may be a display, a touch panel screen, a wearable device, a battery, an elastic organic light emitting diode (OLED) display, an elastic human motion sensor, an elastic artificial muscle, an elastic actuator, or an elastic semiconductor, for example.

Figure 6A:
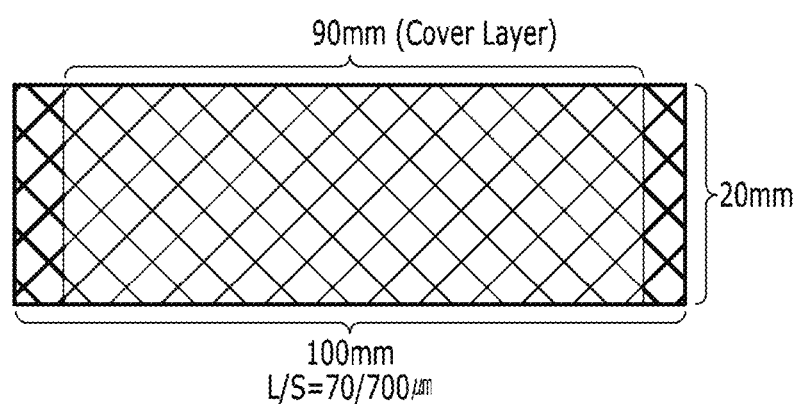
FIG. 6A is a schematic view of a front surface of a flexible wiring board having a mesh pattern obtained from Example 1.
Figure 6B:
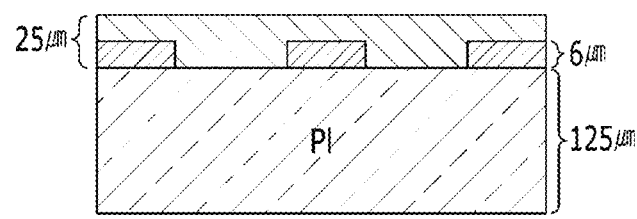
FIG. 6B is a schematic view of a side cross-sectional surface of the flexible wiring board having a mesh pattern obtained from Example 1.

Referring to FIG. 2 as a non-limiting example of the electronic device, the flexible wiring board or the flexible electrically conductive structure according to an embodiment may be employed in a flexible printed circuit substrate (FPC) or a touch screen panel in the display device shown in FIG. 6, or a wire structure (not shown) or a transparent electrode (not shown) of the display, and the like.

Hereinafter, a production method of the flexible electrically conductive structure, e.g., a flexible wiring board, is described in further detail.

The Production Method Includes
preparing a plating bath including a salt of an electrically conductive metal and a nanocarbon material (e.g., a plurality of carbon nanotubes);
disposing a metal plate and a counter electrode in the plating bath;
electrodepositing the electrically conductive metal and the nanocarbon material (e.g., by making a current flow between the metal plate and the counter electrode) to provide a composite on the metal plate, the composite comprising a dispersion of the nanocarbon material in the electrically conductive metal;
rolling the composite to have a thickness of less than or equal to about 50% relative to its initial thickness; and
disposing a polymer layer on a surface of the rolled composite.

The composite may be a co-deposition product, e.g., electrodeposition may cause co-deposition of the electrically conductive metal and the nanocarbon material to provide a co-electrodeposition product on the metal plate. In the electrodeposition the metal plate may be a working electrode.

In preparing the plating bath, the salt of the electrically conductive metal may be a metal cyanide. For example, the metal cyanide may comprise silver cyanide, copper cyanide, nickel cyanide, gold cyanide, aluminum cyanide, or a combination thereof.

The plating bath may further include an alkali metal cyanide such as potassium cyanide, sodium cyanide, and the like; a conductive salt such as potassium carbonate; a brightener; a surfactant; or a combination thereof. The amounts of metal cyanide, alkali metal cyanide, conductive salt, brightener, and surfactant (e.g., a dispersing agent) may be appropriately selected, and are not particularly limited. For example, the conductive salt may be included in the amount as much as it may improve the conductivity of plating bath. The surfactant may improve the dispersibility of carbon nanotube in the plating bath and may include any suitable surfactant, such as a surfactant known to those skilled in the art and/or a commercially available surfactant. Examples of the surfactant include dodecylsodium sulfate (SDS), or hydroxypropyl cellulose (HPC), but are not limited thereto.

The dispersing agent may be included in a range from about $0.1\times10^{-3}$ molar (M) to about $3\times10^{-3}$ M, or a range from about $0.5\times10^{-3}$ M to about $2\times10^{-3}$ M, but is not limited thereto. The range may be selected in view of ensuring the further improved dispersibility of the nanocarbon material, e.g., CNT, without adversely affecting the desirable properties of plated composite. The brightener desirably smooths the surface of metal and may include any suitable brightener, such as a brightener known to those of skill in the art and/or a commercially available brightener.

The carbon nanomaterial (e.g., a plurality of carbon nanotubes) is the same as described above. The content of carbon nanomaterial, e.g., carbon nanotube, may be appropriately selected considering the content of carbon nanomaterial, e.g., carbon nanotube, desired for the electrically conductive layer. For example, the content of carbon nanotube may be greater than or equal to about 1 gram per liter of plating bath, for example, greater than or equal to about 2 grams, greater than or equal to about 3 grams, greater than or equal to about 4 grams, greater than or equal to about 5 grams, greater than or equal to about 6 grams, greater than or equal to about 7 grams, greater than or equal to about 8 grams, or greater than or equal to about 10 grams per liter, but is not limited thereto, and may be about 1 gram per liter (g/L) to about 100 g/L, about 2 g/L to about 80 g/L, or about 4 g/L to about 60 g/L. For the dispersion of the carbon nanotubes, a method comprising stirring, ultrasonic wave dispersion, and the like may be used, but is not limited thereto.

The electrodeposition may comprise disposing the metal plate (e.g., a substrate to be coated) and a counter electrode in the plating bath and flowing current (i.e., applying a voltage between the metal plate and the counter electrode). The kinds of the metal plate and counter electrode are not particularly limited, but may be appropriately selected. The metal plate may include copper, but is not limited thereto. The metal plate may be cleaned before being disposed.

While not wanting to be bound by theory, it is understood that when a voltage is applied, the nanocarbon material (e.g., the plurality of carbon nanotubes) and the electrically conductive metal ion move toward the metal plate in the plating bath and are co-deposited on a surface of the metal plate, thereby providing a structure having a co-deposited composite including a conductive metal and carbon nanotubes dispersed in the conductive metal as disposed on the surface of metal plate. Stirring on the application of the voltage may prevent the nanocarbon material, e.g., the CNTs, from precipitating. The plating conditions are not particularly limited, and may be appropriated selected. For example, the plating may be performed at a temperature of about 10° C. to about 30° C., and at about 0.5 amperes per square decimeter ($A/dm^2$) to about 4 $A/dm^2$, but is not limited thereto.

The thickness of the co-deposited composite may be selected by adjusting the plating time or the like. For example, a thickness of the co-deposited composite may be greater than or equal to about 10 µm, greater than or equal to about 50 µm, or greater than or equal to about 10 µm, but is not limited thereto.

The obtained structure is subject to a rolling process (e.g., a hot rolling, a cold rolling, or a combination thereof) so as to provide the co-deposited composite with a thickness of less than or equal to about 50% of the original length, for example, less than or equal to about 45%, less than or equal to about 40%, less than or equal to about 35%, less than or equal to about 30%, or less than or equal to about 25% of the initial thickness thereof. The rolling increases the orientation of the nanocarbon material to provide a preferred orientation, e.g., to increase the number of carbon nanotubes oriented parallel to the polymer layer, which is understood to provide the improvement of the bending properties.

The rolling process may be performed by passing the structure between at least two rotating rollers. The hot rolling may be performed at a temperature greater than or equal to a recrystallization temperature of metal; and the cold rolling may be performed at a temperature lower than or equal to a recrystallization temperature of metal. The rolling process may be followed by an annealing process, if desired. The annealing may be at 60° C. to 350° C., or 100° C. to 250° C., but it is not limited thereto.

The method may further include removing the metal plate (e.g., a substrate to be coated) from the structure including the co-deposited composite before or after the rolling process by, for example, etching. Details of the etching may be appropriately selected by one of skill in the art without undue experimentation and are thus not further elaborated upon herein.

A polymer layer may be disposed, e.g., stacked or laminated on a surface of the rolled co-deposited composite by, for example, heating and/or pressing. Details of the polymer layer are the same as described for the first polymer layer.

The rolled film (e.g., the electrically conductive layer) disposed on the polymer layer may be patterned by an appropriate patterning method (e.g., photolithography) to provide a wire. The electrical conductor, when in the form of a patterned wire, may have a line width of less than or equal to about 100 µm, for example, less than or equal to about 90 µm, less than or equal to about 80 µm, less than or equal to about 70 µm, less than or equal to about 60 µm, less than or equal to about 50 µm, less than or equal to about 40 µm, less than or equal to about 30 µm, less than or equal to about 20 µm, less than or equal to about 10 µm, less than or equal to about 9 µm, less than or equal to about 8 µm, less than or equal to about 7 µm, less than or equal to about 6 µm, less than or equal to about 5 µm, less than or equal to about 4 µm, less than or equal to about 3 µm, or less than or equal to about 2 µm, but is not limited thereto, and may have a line width of about 1 µm to about 100 µm, or about 2 µm to about 90 µm. The ratio of the line/space is not particularly limited and may be selected appropriately. Details of the patterning of the electrically conductive layer via the photolithography are known in the art and may be appropriately selected by one of skill in the art without undue experimentation and are thus not further elaborated upon herein.

A second polymer layer (e.g., a coverlay) may be disposed on, e.g., laminated on, the patterned electrically conductive layer. Details of the second polymer layer are the same as described above.

In another embodiment, a flexible electrically conductive structure includes
a substrate; and
an electrically conductive layer on a surface of the substrate,
wherein the electrically conductive layer includes an electrically conductive metal and a nanocarbon material (e.g., a plurality of carbon nanotubes) dispersed in the electrically conductive metal. The nanocarbon material has a preferred orientation. The flexible electrically conductive structure may be suitable for use as a bending portion in an electronic device. The flexible electrically conductive structure is to be used with a bending portion provided at least one position of the electrically conductive layer. An additional polymer layer may be disposed on the electrically conductive layer (e.g., to provide a coverlay). The electrically conductive layer may include a rolled product of a co-deposited composite of the electrically conductive metal and the nanocarbon material (e.g., carbon nanotubes) by electrodeposition. In the flexible conductor structure, the nanocarbon material (e.g., carbon nanotubes) may have a preferred orientation, and a content oriented parallel to a surface of the first polymer layer may be greater than a content of a nanocarbon material (e.g., carbon nanotubes) oriented perpendicular to the surface of the first polymer layer.

Details of substrate are the same as described in first polymer layer. Details of the rolled electrically conductive metal and the nanocarbon material, details of the bending portion of the electrically conductive layer, and details of the additional polymer layer (e.g., a second polymer layer) are the same as described above.

The electrically conductive layer may be patterned to have an open space. In the electrically conductive layer, the ratio of the open space may be greater than or equal to about 50%, for example, greater than or equal to about 80%, or greater than or equal to about 99% with respect to a total area of the electrically conductive layer.

The structure may have a resistance change defined by Equation 1:

$$[(R-R_0)/R_0] \times 100\% \qquad (1)$$

of less than about 400% when evaluated using a folding-bending test where it is bent 40000 times with a bending radius of 1 mm.

Herein, $R_0$ and R are the same as defined above.

The structure may be a flexible wiring board, a transparent electrode, or a lead wire.

Hereinafter, the embodiments are illustrated in more detail with reference to examples. However, these examples are exemplary, and the present disclosure is not limited thereto.

EXAMPLES

Reference Example: Preparation of Plating Bath

[1] Preparation of Plating Bath 1:

140 grams per liter (g/L) of potassium cyanide, 40 g/L of silver cyanide, 15 g/L of potassium carbonate, and 4 ml/L of brightener (AgO-56, manufactured by ATO Technical) are placed into a reaction vessel including water and completely dissolved. The brightener has a silver purity of 99.10% and includes selenium.

The obtained solution is treated with an 2-3 g/L activated carbon and filtered and then added with 5 ml/L surfactant (Silver Glow TY, manufactured by MaeruTex Co., Ltd.) and added with 10 g/L carbon nanotube (VGCF, manufactured by Showa Denko Co., Ltd.) and stirred with ultrasonication for 15 minutes to form a dispersion. The process (stirring with ultrasonication for 15 minutes) is repeated for 5 times to obtain Plating bath 1.

[2] Preparation of Plating Bath 2:

Plating bath 2 is obtained in accordance with the same procedure as in Preparation of Plating Bath 1, except that the carbon nanotube has a concentration of 5 g/L.

[3] Preparation of Plating Bath 3:

Plating bath 3 is obtained in accordance with the same procedure as in Preparation of Plating Bath 1, except that the carbon nanotube has a concentration of 1 g/L.

[4] Preparation of Plating Bath 4:

Plating bath 4 is obtained in accordance with the same procedure as in Preparation of Plating Bath 1, except that the carbon nanotube is not included.

Example 1

Figure 3:
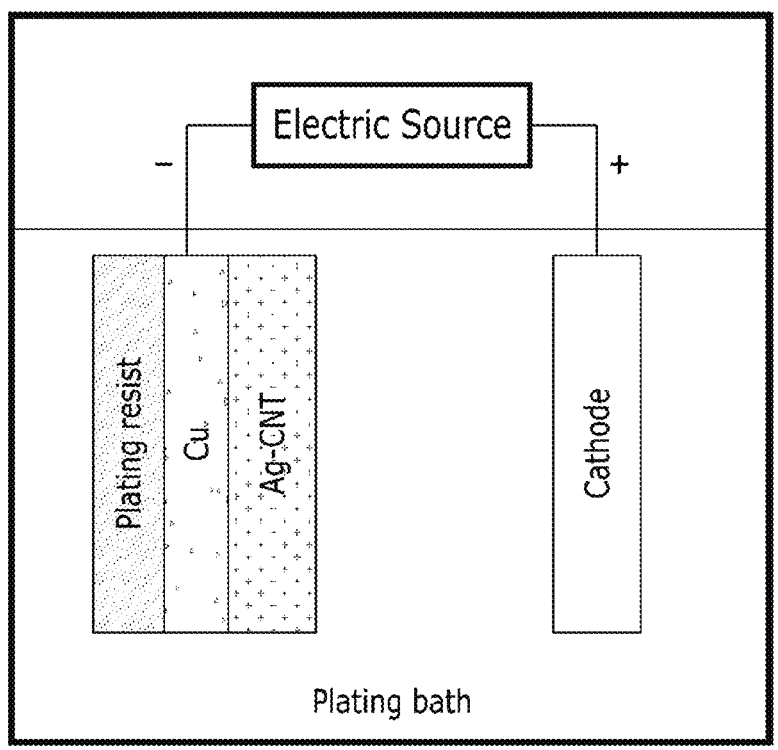
FIG. 3 is a schematic cross-sectional view of an embodiment of a plating device for producing a flexible wiring board.
Figure 4:
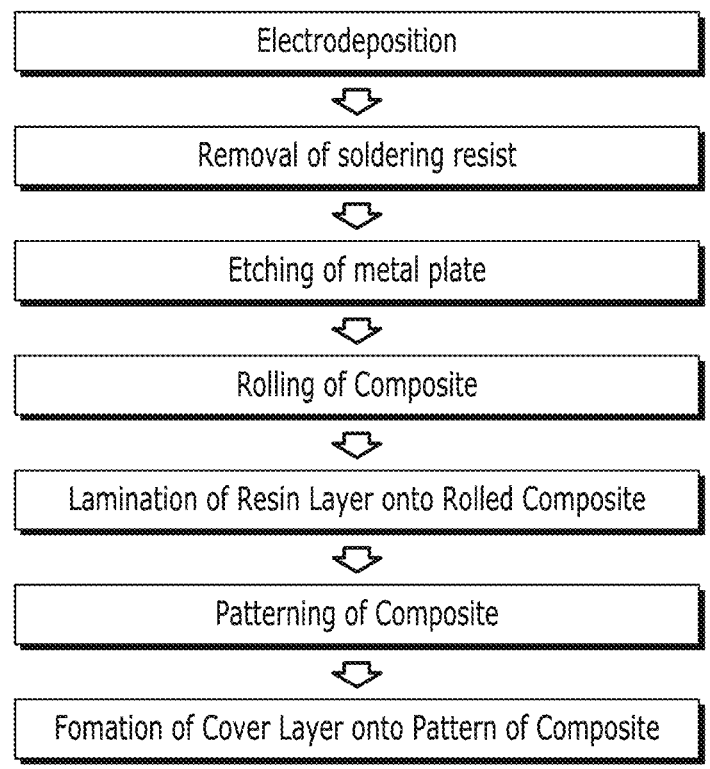
FIG. 4 is a schematic flow chart of an embodiment of a process for producing a wiring board.

The plating is performed using the device schematically shown in FIG. 3. FIG. 4 shows a flow chart of a method of manufacturing a flexible wiring board.

[1] A rolled copper foil having a size of 10 centimeters (cm)×10 cm×6 μm is prepared as an article to be coated, and a plating resist (Potech RY5319, manufactured by Hitachi Chemical) is formed on a surface not to be coated.

The rolled copper foil (i.e., negative electrode, anode) as a substrate to be coated, which is preliminarily degreased for 10 minutes, and the counter electrode (i.e., positive electrode, cathode) are disposed in Plating bath 1, and the plating bath is stirred at a temperature of 20° C. With stirring, the anode and the cathode are connected with a power source and a current at an average current density of 1 A/dm$^2$ is provided to perform an electrodeposition (plating). The obtained electrodeposited product (hereinafter, referred to as a silver-CNT composite) has a thickness of 30 μm.

After the completion of the plating, the photoresist is removed, and the copper foil is removed by etching the same using a copper-selective etching solution (CS, commercially available from Japanese Chemical Industry Co., Ltd.).

The silver-CNT composite, having a thickness of 30 μm, is repeatedly cold rolled until it has a thickness of 6 μm, to provide a thickness reduction (also referred to as a rolling ratio) of 20%.

The percent reduction (rolling ratio) is calculated as follows:

Percent Reduction (%)=[thickness of metal after rolling/thickness of metal before rolling]×100%

5 sheets of polyimide film (UPILEX-25VT, UBE INDUSTIRES, LTD.), each having a thickness of 25 μm, are laminated on the rolled silver-CNT composite under heating/pressing, to provide a 10 cm×10 cm structure, and the silver-CNT composite, having a thickness of 6 μm, is placed on the polyimide layer having a thickness of 125 μm. By the rolling, at least a portion of the CNTs in the conductive layer are oriented parallel to the surface of the polymer layer (the substrate). The scanning electron microscopic analysis confirms that the number of the oriented CNTs is greater than the non-oriented CNTs (e.g., vertical to the polymer layer (the substrate).

Figure 5:
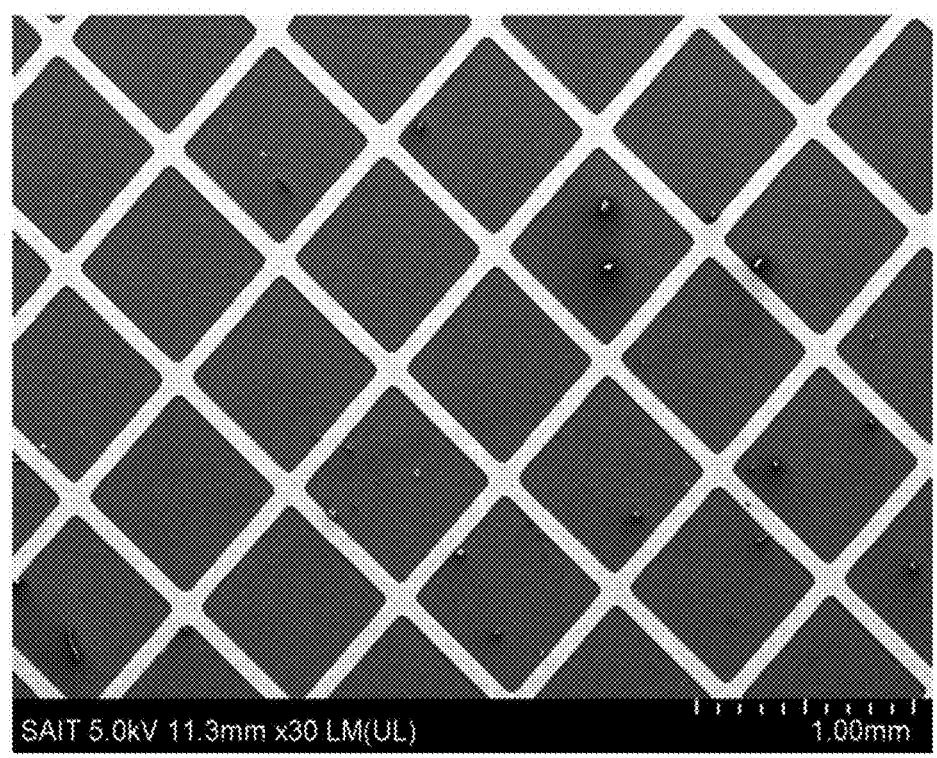
FIG. 5 is a front side SEM image of a flexible wiring board having a mesh pattern obtained from Example 1.

Subsequently, the silver-CNT composite is patterned using photolithography to provide a mesh shape having a line (L)/space (S) ratio of 70 μm/700 μm in all directions. FIG. 5 shows a scanning electron microscope (SEM) photograph of the obtained pattern.

A polyimide coverlay film CISV1215 (manufactured by Nikhan Industries, Co., Ltd.), having a thickness of about 25 μm, is stacked on the mesh pattern of the silver-CNT composite using the heating and pressing process and cut in a selected size to provide a flexible wiring board. FIG. 6 shows a schematic view showing the obtained flexible wiring board.

Also, from the calculated results, it is confirmed that the metal foil has a strain (ε) of 0.037.

[2] A portion of the obtained silver-CNT composite is sampled. The sample is input into concentrated nitric acid to completely dissolve and remove the silver matrix, and the carbon nanotube in the obtained solution is filtered and recovered and cleaned with water, and then vacuum-dried and weighted. From the results, it is confirmed that the carbon nanotube content in the silver-CNT composite is 0.112 wt %, based on the total weight of the silver-CNT composite.

Example 2

[1] A wiring board according to Example 2 is manufactured in accordance with the same procedure as in Example 1, except that the silver-CNT composite having a thickness of 12 μm is obtained using the plating bath 1 and rolled and stretched to a thickness of 6 μm.

[2] From the results measured in accordance with the same procedure as in Example 1, it is confirmed that the carbon nanotube content in the obtained silver-CNT composite is 0.095 wt %, based on the total weight of silver-CNT composite.

Example 3

[1] A wiring board according to Example 3 is manufactured in accordance with the same procedure as in Example 1, except that the plating bath 2 is used instead of the plating bath 1.

[2] From the results measured in accordance with the same procedure as in Example 1, it is confirmed that the carbon nanotube content in the obtained silver-CNT composite is 0.063 wt %, based on the total weight of silver-CNT composite.

Example 4

[1] A wiring board according to Example 4 is manufactured in accordance with the same procedure as in Example 1, except that it is plated using the plating bath 1 to provide a silver-CNT composite having a thickness of 6 μm, and the rolling is omitted.

[2] From the results measured in accordance with the same procedure as in Example 1, it is confirmed that the carbon nanotube content in the obtained silver-CNT composite is 0.063 wt %, based on the total weight of silver-CNT composite.

Example 5

[1] A wiring board according to Example 5 is manufactured in accordance with the same procedure as in Example 1, except that the plating bath 3 is used instead of the plating bath 1.

[2] From the results measured in accordance with the same procedure as in Example 1, it is confirmed that the carbon nanotube content in the obtained silver-CNT composite is 0.011 wt %, based on the total weight of silver-CNT composite.

Comparative Example 1

Figure 7:
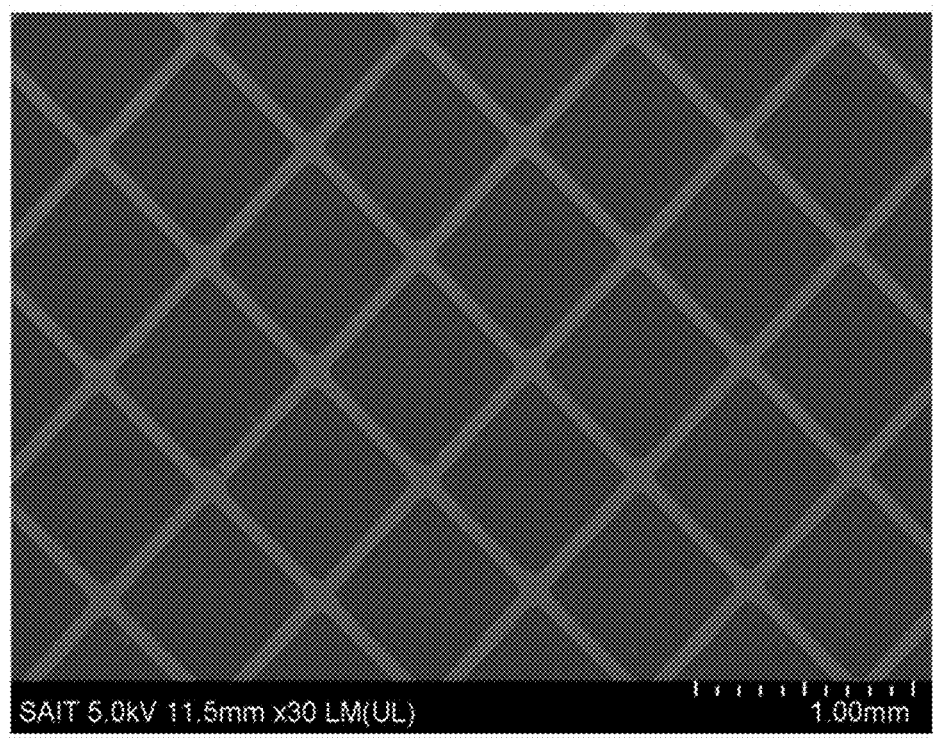
FIG. 7 is a front side SEM image showing a flexible wiring board having a mesh pattern obtained from Comparative Example 1.

A wiring board of Comparative Example 1 is manufactured in accordance with the same procedure as in Example 1, except that a (CNT-free) plating bath 4 is used instead of the plating bath 1. FIG. 7 shows a scanning electron microscope image of the obtained wiring board surface.

Comparative Example 2

A wiring board is manufactured in accordance with the same procedure as in Example 1, except that 6 μm rolled copper (HA-V2 foil, JX Niko Japan Petroleum Metal., Ltd.) is used as an electrically conductive layer without performing the plating process.

Comparative Example 3

Commercially available aluminum foil having a thickness of 30 μm is rolled to provide a 6 μm-thick rolled aluminum foil. A wiring board is manufactured in accordance with the same procedure as in Example 1, except that the rolled aluminum foil is used without performing the plating process.

Experimental Example 1: Measurement of Sheet Resistance

For wiring boards according to Examples 1 to 5 and Comparative Example 1, a sheet resistance is measured using a sheet resistance measuring device (model MCP-T610, manufactured by MITSUBISHI Chemical Analytech), and the results are shown in Table 1:

TABLE 1

| Sample | Sheet Resistance Ω/□ |
|---|---|
| Example 1 | 0.0226 |
| Example 3 | 0.0234 |
| Example 5 | 0.0250 |
| Example 2 | 0.0228 |
| Example 4 | 0.0230 |
| Comparative Example 1 | 0.0254 |

From the results shown in Table 1, it is confirmed that adding carbon nanotube does substantially not change the sheet resistance of the sample (i.e., there is no negative influence on conductivity).

Experimental Example 2: Analysis of Bending Properties by Measuring Resistance Variation For the wiring boards according to Examples 1 to 5 and Comparative Examples 1 to 3, a resistance change is measured, and the results are shown in Table 2 and FIG. 8 (Examples 1 to 5 and Comparative Example 1), FIG. 9 (Comparative Example 2) and FIG. 10 (Comparative Example 3).

Figure 8:
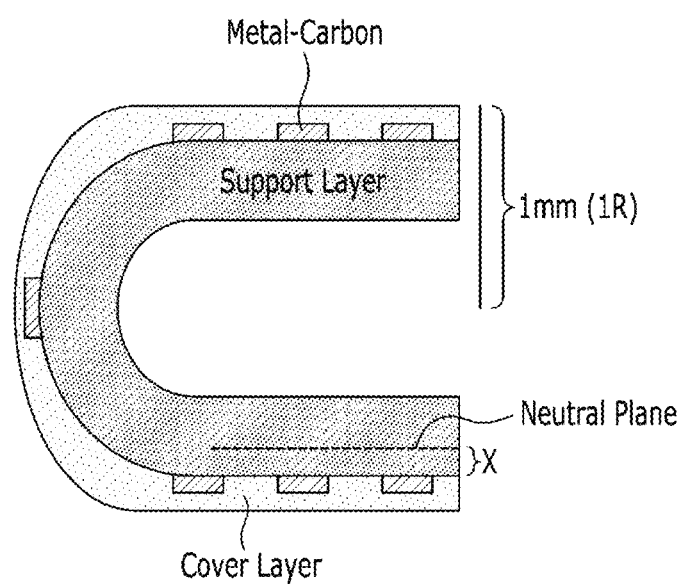
FIG. 8 is a schematic view showing an experimental device for evaluating a bending property in Experimental Example 2.

A resistance before the bending ($R_0$) is measured at a width of 20 mm and a length of 90 mm from the exposed substrate terminal region. Subsequently, the central part of wiring board (i.e., a location 50 mm from the edge) is folded at 180° in a curvature radius of 1 mm (to be inside with the wire outside). In the continuous bending test, a flex tester (model CFT-200 R, Flexible tester series, manufactured by Covotech) is used. The flex tester, shown schematically in FIG. 8, is used to provide 75,000 cycles at maximum at a speed of 1 cycle/2 seconds. At the predetermined cycle, the resistance (R) is measured at a width of 20 mm and a length of 90 mm from the exposed substrate terminal region using a resistance measuring device (a 34401 A Multimeter, manufactured by Hewlett Packard), and the resistance change is obtained according to the following formula:

$$[(R_0-R)/R_0]\times 100\% = \text{percent resistance change}$$

TABLE 2

| | Number of bending cycles | | | | | |
|---|---|---|---|---|---|---|
| | 0 | 2,000 | 5,000 | 10,000 | 40,000 | 75,000 |
| Example 1 | 0.00 | 0.00 | 0.54 | 32.97 | 61.08 | 522.70 |
| Example 3 | 0.00 | 0.00 | 0.00 | 48.96 | 83.33 | 1125.52 |
| Example 5 | 0.00 | 0.00 | 0.49 | 89.76 | 323.90 | 2112.68 |
| Example 2 | 0.00 | 0.53 | 1.07 | 37.43 | 73.80 | 578.61 |
| Example 4 | 0.00 | 1.06 | 2.13 | 52.13 | 111.70 | 1426.06 |
| Comparative Example 1 | 0.00 | 0.00 | 0.48 | 111.06 | 448.08 | 2400.48 |

Figure 9:
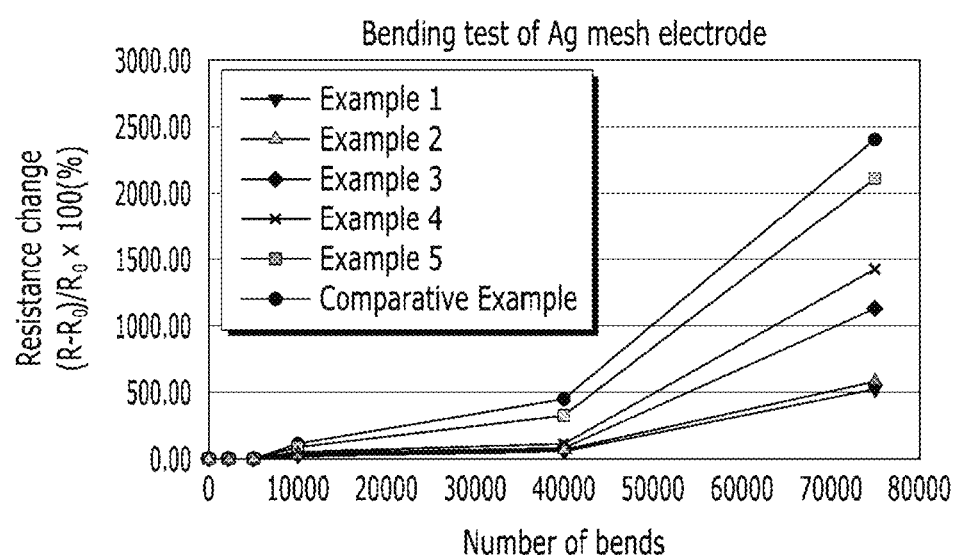
FIG. 9 is a graph of resistance change (percent, %) versus number of bends showing the results of a bending test of Experimental Example 2.

From the results shown in Table 2 and FIG. 9, the following conclusions can be made.

The wiring board of Comparative Example 1 does not include carbon nanotube but uses silver wire. Examples 1 to 5 are silver wires including carbon nanotube. It is confirmed that the wiring boards according to Examples 1 to 5 have lower resistance change than the wiring board of Comparative Example 1 after the bending cycle. In other words, it is confirmed that the bending properties are improved by adding carbon nanotube.

In Example 5, the carbon nanotube content is lowest among Examples; the resistance change is lower than Comparative Example 1 but is higher than other Examples. Thus it is confirmed that the carbon nanotube content may be greater than or equal to about 0.01 wt %, based on the total weight of the silver-CNT composite. From the results of Examples 1 to 3, it is confirmed that the bending resistance is increased when the carbon nanotube content is increased.

Wiring boards according to Example 2 and Example 4 have same carbon nanotube content but have different rolling ratios, 50% and 100%, respectively. The rolling ratio 100% represents the case where no rolling occurs. The reduction ratio 50% represents the case where the thickness of the rolled product is reduced by half of the original thickness. The reduction ratio 10% represents the case where the thickness of the rolled product is reduced to one fifth (⅕) of the original thickness. As the rolling degree increases (i.e., the rolling ratio decreases), the more number of the CNTs may be oriented in a parallel direction. It is confirmed that the increase of resistance change may be remarkably decreased by the rolling. Without wishing to be bound by any theory, it is believed that the rolling may increase the dispersibility of carbon nanotube in the metal foil and at the same time may increase the number of carbon nanotubes oriented parallel to the substrate.

Figure 10:
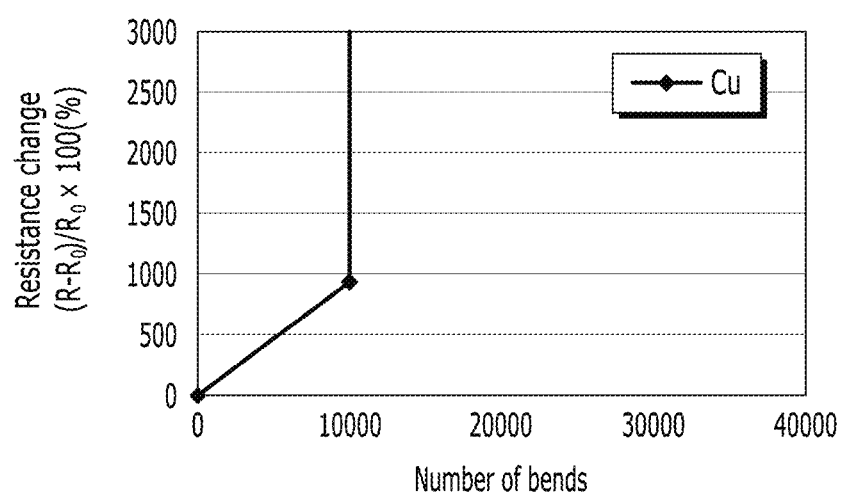
FIG. 10 is a graph of resistance change versus number of bends showing a resistance change of a specimen after a bending test of the rolled copper wiring board of Comparative Example 2.
Figure 11:
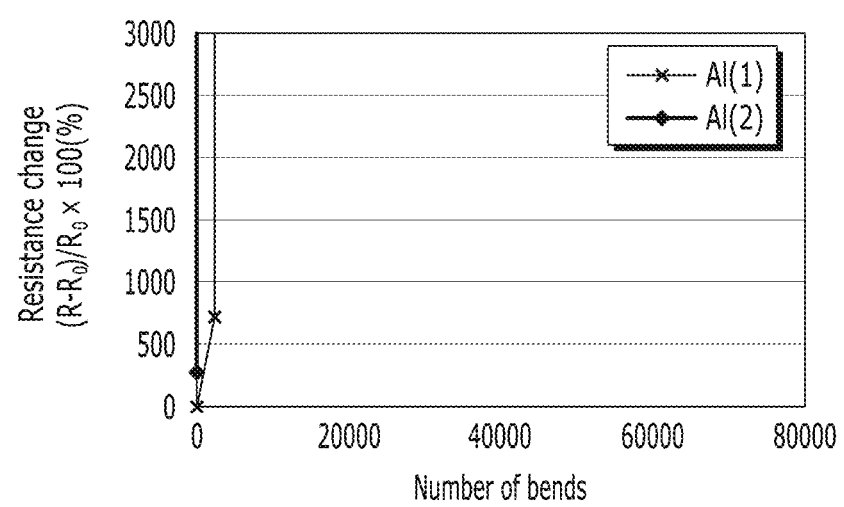
FIG. 11 is a graph of resistance change versus number of bends showing a resistance change of a specimen after a bending test of the aluminum wiring board of Comparative Example 3.

FIG. 10 is a graph of resistance change of a specimen after a bending test of the rolled copper wiring board of Comparative Example 2; and FIG. 11 is a graph of resistance change of a specimen after a bending test (conducted twice) of the aluminum wiring board of Comparative Example 3. It is confirmed that the rolled copper wiring board of Comparative Example 2 and the rolled aluminum wiring board of Comparative Example 3 exhibit very unfavorable bending properties. In other words, the silver wire may provide better bending properties than the copper wire or the aluminum wire. The application of silver wire to wire has been limited since it is easily sulfidized in the air and causes ion migration. But the wiring board according to the Examples may solve all the problems relating silver wires, so that the bending properties may be improved.

The experiment is performed for a thickness of metal thickness suitable for a FPC. However, the metal thickness has a correlation with bending properties. As disclosed by JX metal (http://www.nmm.jx-group.co.jp/products/rolled_copper_foil/ha.html, accessed on Jan. 28, 2016), metal thickness correlates with the bending properties, and the bending properties are improved as the thickness is decreased. In this regard, a separate reliable test using a rolled copper foil shows that when the thickness of the copper foil is decreased to two third of the original thickness, the life-span as measured by the bending test may increase by about 2 times, which may correspond to the result disclosed by JX metal. In the bending test, the life span is determined at the time when the increase of the resistance is about 10%.

Figure 12:
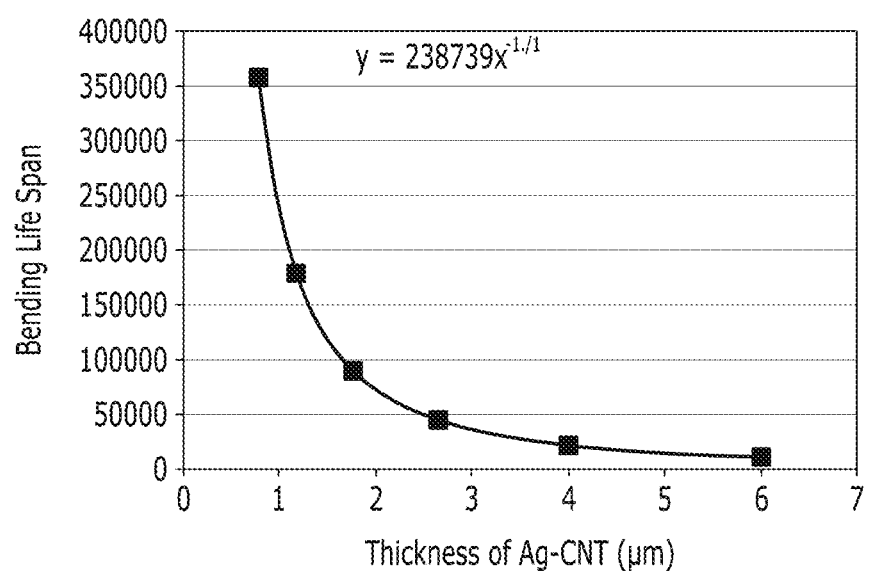
FIG. 12 as a graph of bending life span versus thickness (micrometers), which shows a relationship between a thickness of Ag-CNT and a bending life-span, calculated through a simulation wherein the bending resistance test is performed using 6 μm Ag-CNT with the life-span of 6200 times (the life-span is calculated by a linear approximation from the results of 5000 bending cycles and 10000 bending cycles).

FIG. 12 shows a relationship between a Ag-CNT thickness and a life-span when measured using the bending test. The relationship therebetween is obtained by conducting a simulation in the following manner. A 6 μm Ag-CNT composite is used and the life span of the bending properties test is set to be 6200 bending cycles. The life span is calculated by a straight line approximation from the results at 5000 bending cycles and 10000 bending cycles. The results of FIG. 12 confirm that the life-span may be further extended by decreasing the thickness of the Ag-CNT composite.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A flexible electrically conductive structure comprising:
a first polymer layer; and
an electrically conductive layer disposed on a surface of the first polymer layer, the electrically conductive layer including an electrically conductive metal and a nanocarbon material dispersed in the electrically conductive metal, and at least a portion of the nanocarbon material having an orientation that is not random, wherein
the nanocarbon material includes a plurality of carbon nanotubes,
at least a portion the plurality of carbon nanotubes is oriented parallel to a surface of the first polymer layer,
a total number of the plurality of carbon nanotubes in the electrically conductive layer oriented parallel to the surface of the first polymer layer is greater than a total number of the plurality of carbon nanotubes in the electrically conductive layer oriented perpendicular to the surface of the first polymer layer,
a content of the nanocarbon material is greater than or equal to about 0.05 weight percent and less than or equal to about 1 weight percent, based on a total weight of the electrically conductive layer, and
a ratio of a final electrical resistance of the flexible electrically conductive structure with respect to an initial electrical resistance of the flexible electrically conductive structure is less than or equal to about 5 when the flexible electrically conductive structure is bent 40000 times at a bending radius of 1 millimeter.

2. The flexible electrically conductive structure of claim 1, wherein the nanocarbon material comprises fullerene, graphene, or a combination thereof.

3. The flexible electrically conductive structure of claim 1, further comprising: a second polymer layer on the electrically conductive layer.

4. The flexible electrically conductive structure of claim 3, wherein the first polymer layer and the second polymer layer are electrically insulating.

5. The flexible electrically conductive structure of claim 3, wherein the first polymer layer and the second polymer layer each independently comprise one of a polyester, a polyacryl, a polyolefin, a cellulose, a polycarbonate, a polyimide, a polyamide, a polyphenylenesulfide, a polyetheretherketone, a liquid crystal polymer, an epoxy, or a combination thereof.

6. The flexible electrically conductive structure of claim 1, wherein the electrically conductive metal comprises one of silver, copper, nickel, gold, aluminum, tungsten, platinum, iron, or a combination thereof.

7. The flexible electrically conductive structure of claim 6, wherein the electrically conductive metal comprises silver.

8. The flexible electrically conductive structure of claim 1, wherein the electrically conductive layer is a rolled product of a co-deposited composite of the electrically conductive metal and the nanocarbon material by electrodeposition.

9. The flexible electrically conductive structure of claim 8, wherein the rolled product is a product of rolling the co-deposited composite to have a thickness of less than or equal to about 50% relative to its initial thickness.

10. The flexible electrically conductive structure of claim 1, wherein the flexible electrically conductive structure has a bending portion, and wherein a curvature radius of the bending portion is less than or equal to 3 millimeters.

11. The flexible electrically conductive structure of claim 1, wherein the flexible electrically conductive structure is configured for a repetitive operation comprising one of sliding bending, folding bending, hinge bending, or a combination thereof.

12. The flexible electrically conductive structure of claim 1, wherein a thickness of the electrically conductive layer is from about 0.2 micrometer to about 20 micrometers.

13. The flexible electrically conductive structure of claim 1, wherein a thickness of the first polymer layer is from about 10 micrometer to about 150 micrometer.

14. The flexible electrically conductive structure of claim 1, wherein the flexible electrically conductive structure is a flexible wiring board.

15. An electronic device comprising the flexible electrically conductive structure of claim 1.

16. The electronic device of claim 15, wherein the flexible electrically conductive structure is a flexible wiring board, a transparent electrode, or a lead wire.

17. A method of manufacturing the flexible electrically conductive structure of claim 1, the method comprising
preparing a plating bath comprising a salt of an electrically conductive metal and a nanocarbon material;
disposing a metal plate and a counter electrode in the plating bath;
electrodepositing the electrically conductive metal and the nanocarbon material to provide a co-deposited composite on the metal plate, the co-deposited composite comprising a dispersion of the nanocarbon material in the electrically conductive metal;
rolling the composite to have a thickness of less than or equal to about 50% of its initial thickness; and
disposing a polymer layer on a surface of the rolled composite to manufacture the flexible electrically conductive structure.

18. The method of claim 17, wherein the rolling increases a degree of orientation of the nanocarbon material parallel to a surface of the first polymer layer.

19. A flexible wiring board, comprising
a substrate; and
an electrically conductive layer on a surface of the substrate,
the electrically conductive layer including an electrically conductive metal and a plurality of carbon nanotubes dispersed in the electrically conductive metal, and at least a portion of the plurality of carbon nanotubes having an orientation that is not random,
a total number of the plurality of carbon nanotubes in the electrically conductive layer oriented parallel to the surface of the substrate is greater than a total number of the plurality of carbon nanotubes in the electrically conductive layer oriented perpendicular to the surface of the substrate,
a content of the plurality of carbon nanotubes is greater than or equal to about 0.05 weight percent and less than or equal to about 1 weight percent, based on a total weight of the electrically conductive layer, and
an electrical resistance change of the flexible wiring board is less than about 400% when the flexible wiring board is bent 40,000 times at a bending radius of 1 mm.

20. The flexible wiring board of claim 19, wherein the electrically conductive layer includes a rolled product of a co-deposited composite of the electrically conductive metal and the plurality of carbon nanotubes by electrodeposition.

21. The flexible wiring board of claim 19, wherein the electrically conductive layer is patterned to have an open space.

22. The flexible electrically conductive structure of claim 1, wherein
the electrically conductive layer is a composite including the nanocarbon material dispersed in a matrix of the electrically conductive metal.

23. The flexible electrically conductive structure of claim 1, wherein the electrically conductive layer is a patterned electrically conductive layer that includes a plurality of electrically conductive portions spaced apart from each other.

24. The flexible wiring board of claim 19, wherein the electrically conductive layer is a patterned electrically conductive layer that includes a plurality of electrically conductive portions spaced apart from each other.

* * * * *